(12) United States Patent
Esaki et al.

(10) Patent No.: US 8,564,213 B2
(45) Date of Patent: Oct. 22, 2013

(54) SWITCHING POWER CIRCUIT, AND LIGHTING DEVICE FOR SEMICONDUCTOR LIGHT-EMITTING ELEMENT AND ILLUMINATION APPARATUS USING SAME

(75) Inventors: Sana Esaki, Ibaraki (JP); Akinori Hiramatu, Nara (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 13/359,654

(22) Filed: Jan. 27, 2012

(65) Prior Publication Data
US 2012/0194090 A1 Aug. 2, 2012

(30) Foreign Application Priority Data

Jan. 28, 2011 (JP) ................. 2011-016676

(51) Int. Cl.
*H05B 37/00* (2006.01)
*H05B 39/00* (2006.01)
*H05B 41/14* (2006.01)

(52) U.S. Cl.
USPC ......... 315/200 R; 315/201; 315/289; 315/291

(58) Field of Classification Search
None
See application file for complete search history.

(56) References Cited

U.S. PATENT DOCUMENTS 8,482,944 B1 * 7/2013 Fukuda ............................ 363/53
2011/0309759 A1 * 12/2011 Shteynberg et al. ........... 315/201

FOREIGN PATENT DOCUMENTS

JP 2008-104274 5/2008

* cited by examiner

*Primary Examiner* — Anh Tran
(74) *Attorney, Agent, or Firm* — Bacon & Thomas, PLLC

(57) ABSTRACT

A switching power circuit includes a first switching element having one end connected to a positive electrode of a first capacitor, a second switching element having one end connected to a negative electrode of the first capacitor, an inductive element having one end connected to the other ends of the first and the second switching element, a semiconductor switching element connected in parallel to the current limiting resistor, and a second capacitor connected to a control electrode of the semiconductor switching element. The second capacitor is charged by using a voltage induced to the inductive element when the first or the second switching element is off.

8 Claims, 3 Drawing Sheets

SWITCHING POWER CIRCUIT, AND LIGHTING DEVICE FOR SEMICONDUCTOR LIGHT-EMITTING ELEMENT AND ILLUMINATION APPARATUS USING SAME

FIELD OF THE INVENTION

The present invention relates to a switching power circuit, and a lighting device for semiconductor light-emitting element and an illumination apparatus using same.

BACKGROUND OF THE INVENTION

Japanese Patent Application Publication No. 2008-104274 (especially, FIG. 1 and paragraph [0026]) discloses an LED (light emitting diode) lighting device for lighting LEDs by power-converting a DC voltage, which has been obtained by rectifying and smoothing an AC voltage, by a DC-DC converter. The lighting device includes an inrush current preventing circuit in which a parallel circuit of a current limiting resistor and a thyristor is positioned between a rectifying circuit and a smoothing capacitor. An inrush current to the smoothing capacitor is restrained at an initial stage of power input by the current limiting resistor and the thyristor is turned on in case of normal lighting to thus restrain a loss of power due to the current limiting resistor. In addition, this technique discloses a configuration in which a gate driving current of the thyristor of the inrush current preventing circuit is supplied by rectifying and smoothing a flyback current which is obtained from an intermediate tab of an inductive element of the DC-DC converter.

In the foregoing patent document, the DC-DC converter has a configuration in which a serial circuit of a switching element and a primary coil of a transformer is connected in parallel to the smoothing capacitor. Thus, one end of the primary coil of the transformer as an inductive element can be connected to a cathode of the thyristor of the inrush current preventing circuit and a voltage of the capacitor charged through a diode from the intermediate tab of the primary coil can be supplied between the gate and the cathode of the thyristor. Same configuration may also be used also in a boosting chopper circuit.

Meanwhile, when the DC-DC converter is a step-down chopper circuit, the inductor as an inductive element is normally connected to the smoothing capacitor serving as an input DC power source through a load circuit or a switching element, rather than being directly connected thereto. This is because there is a necessity to configure a closed circuit by the inductive element, the load circuit, and a flyback diode in the step-down chopper circuit. Therefore, if the inductive element is directly connected to the input DC power source, the load circuit is separated from the potential of the input DC power source.

In this case, the potential of the load circuit is changed in an RF manner; and thus, for example, when it is used in a power source separation type LED lighting device, e.g., as shown in FIG. 5, it causes RF radiation noise. Thus, in such configuration, in particular, one end of the load circuit is required to be directly connected to the input DC power source to stabilize the potential, and as a result, an inductor L1 as an inductive element is connected to the input DC power source through the load circuit or the switching element as illustrated in FIGS. 1 to 3. For this reason, when the DC-DC converter is a step-down chopper circuit, the configuration of above-described cannot be applied as it is.

SUMMARY OF THE INVENTION

In view of the above, the present invention provides a switching power circuit to supply a driving current of an inrush current preventing circuit from an inductive element of the switching power circuit even when the inductive element is not directly connected to a smoothing capacitor.

In accordance with a first aspect of the present invention, there is provided a switching power circuit that includes a rectifying circuit for rectifying AC power; a first capacitor connected to an output terminal of the rectifying circuit through a current limiting resistor for restraining an inrush current, the first capacitor being a smoothing capacitor; a first switching element having one end connected to a positive electrode of the first capacitor; a second switching element having one end connected to a negative electrode of the first capacitor; an inductive element having one end connected to the other ends of the first and the second switching element; a semiconductor switching element connected in parallel to the current limiting resistor; and a second capacitor connected to a control electrode of the semiconductor switching element, wherein the second capacitor is charged by using a voltage induced to the inductive element when the first or the second switching element is off.

In this aspect, preferably, a negative electrode of the second capacitor is connected to the positive electrode of the first capacitor, wherein the switching power circuit further includes a third capacitor having a negative electrode connected to said one end of the inductive element; and a current path for transmitting charges toward a positive electrode of the second capacitor from a positive electrode of the third capacitor when the first switching element is on.

In this aspect, preferably, the third capacitor is charged from an intermediate tab of the inductive element or charged by a voltage applied between two ends of the first switching element when the second switching element is on.

In this aspect, preferably, the first switching element has a control electrode, wherein the switching power circuit further includes a control circuit for providing a control signal to the control electrode, and wherein the third capacitor provides a control power voltage to the control circuit.

Alternatively, the second switching element may have a control electrode, wherein the switching power circuit further includes at the negative electrode side of the first capacitor, a control circuit for providing a control signal to the control electrode; and a control power circuit for providing a control power voltage to the control circuit, wherein the switching power circuit further includes a current path for allowing a charge current to flow to the positive electrode of the third capacitor from a positive electrode of the control power circuit when the second switching element is on.

In this aspect, preferably, one of the first and the second switching element has a control electrode, and the other is a diode reversely biased by the first capacitor.

In accordance with a second aspect of the present invention, there is provided a lighting device for lighting a semiconductor light-emitting element, the lighting device including the switching power circuit of the first aspect.

In accordance with a third aspect of the present invention, there is provided an illumination apparatus that includes the lighting device of the second aspect and the semiconductor light-emitting element.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
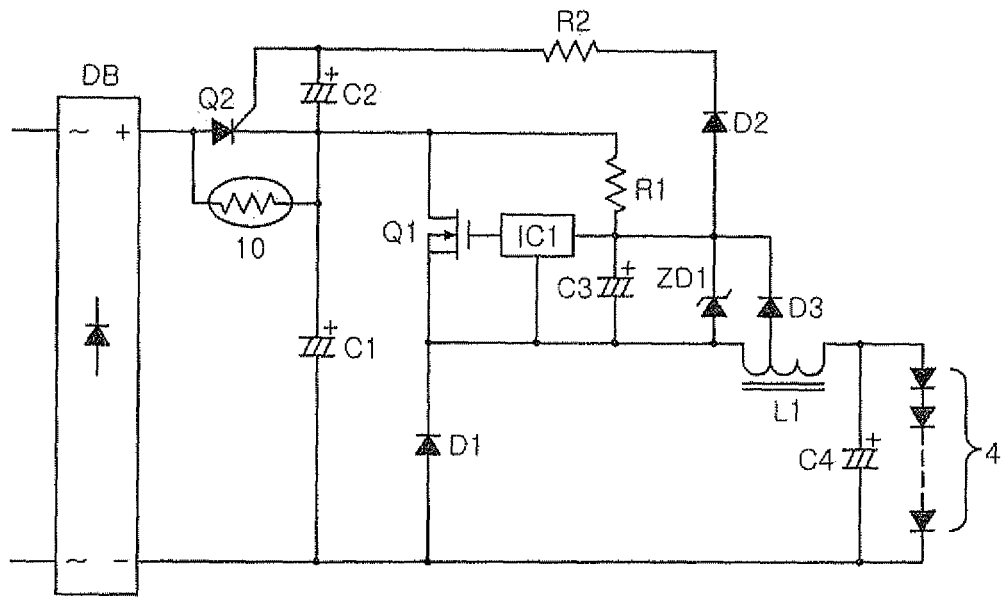
FIG. 1 is a circuit diagram of a switching power circuit in accordance with a first embodiment of the present invention.

Hereinafter, embodiments of the present invention will be described in more detail with reference to the accompanying drawings that constitute a part of the present invention. In the drawings, same reference numerals are used for the same or like parts and a repeated description thereof will be omitted.

Embodiment 1

FIG. 1 is a circuit diagram of a switching power circuit for a semiconductor light-emitting element 4 in accordance with a first embodiment of the present invention. A smoothing capacitor C1 is connected to a DC output terminal of a rectifying circuit DB which performs full-wave rectifying of the commercial AC power through a positive temperature coefficient (PTC) thermistor 10 serving as a current limiting resistor. A reverse-blocking triode thyristor Q2 is connected in parallel to the PTC thermistor 10. The thyristor Q2 and the PTC thermistor 10 constitute an inrush current preventing circuit. A capacitor C2 for charge accumulation is connected in parallel between a gate and a cathode of the thyristor Q2. The capacitor C2 is not charged at an initial stage of power input.

Thus, the thyristor Q2 is turned off at the initial stage of power input, and the smoothing capacitor C1 is charged through the FTC thermistor 10. Accordingly, an inrush (or surge) current is restrained.

A step-down chopper circuit including a switching element Q1, a diode D1, an inductor L1, and a smoothing capacitor C4 is connected to the smoothing capacitor C1. The semiconductor light-emitting element 4 formed of, e.g., a series circuit of LEDs is connected in parallel to the smoothing capacitor C4.

The switching element Q1 is on-off controlled by a control circuit IC1. The control circuit IC1 is an oscillation circuit outputting an RF square wave voltage signal. A control power voltage of the control circuit IC1 is supplied from a smoothing capacitor C3.

The smoothing capacitor C3 is charged through a resistor R1 by the voltage applied between two ends of the switching element Q1 at the initial stage of power input. Namely, the smoothing capacitor C3 is charged as a current flows along a path of a positive electrode of the smoothing capacitor C1→the resistor R1→the smoothing capacitor C3→the inductor L1→the smoothing capacitor C4→a negative electrode of smoothing capacitor C1. When the charged voltage of the smoothing capacitor C3 reaches an operation voltage of the control circuit IC1, an oscillation operation of the control circuit IC1 starts and the switching element Q1 is on-off controlled by RF.

When the switching element Q1 is turned on, a current flows along a path of the positive electrode of the smoothing capacitor C1→the switching element Q1→the inductor L1→the smoothing capacitor C4→the negative electrode of the smoothing capacitor C1 to accumulate energy in the inductor L1. When the switching element Q1 is turned off, the accumulated energy of the inductor L1 is discharged as a flyback current along a path of the inductor L1→the smoothing capacitor C4→the diode D1. At this time, the recovery current flows also to the smoothing capacitor C3 through a diode D3 from an intermediate tab of the inductor L1 to supply the control power voltage of the control circuit IC1. The voltage of the smoothing capacitor C3 becomes a constant voltage regulated by a Zener diode ZD1.

When the switching element Q1 is in the ON state, the capacitor C2 is charged through a diode D2 and a resistor R2 by the voltage of the smoothing capacitor C3. Accordingly, when the voltage of the capacitor Q2 is increased to be higher than a firing voltage of the reverse-blocking triode thyristor Q2, the thyristor Q2 is turned on. Thereafter, since the PTC thermistor 10 is shorted by the thyristor Q2, an unnecessary loss of power by the PTC thermistor 10 is not caused.

Further, when the switching element Q1 is in an ON state, the voltage of the smoothing capacitor C3 flows also to the switching element Q1 through the resistor R1, but here, since the resistor R1 is a startup resistor having high resistance, the power loss is negligible. Also, if necessary, a diode (not shown) for preventing a reverse current may be connected in series to the resistor R1 to prevent discharging of the capacitor C3 through the resistor R1.

In accordance with the present embodiment, the thyristor Q2 of the inrush current preventing circuit can be fired by securing the control power voltage of the control circuit IC1 of the switching element Q1 by the recovery current of the inductor L1 of the step-down chopper circuit and transmitting the control power voltage to the capacitor C2 when the switching element Q1 is turned on. Thus, the thyristor Q2 is turned on after the voltages of the smoothing capacitors C1 and Q3 are increased and the step-down chopper circuit starts to perform switching operation, and accordingly, the inrush current at the initial stage of power input can be reliably prevented.

Furthermore, the thyristor Q2 of the inrush current preventing circuit may be a semiconductor switching element of another type (e.g., power MOSFET or the like). Also, the PTC thermistor 10 of the inrush current preventing circuit may be a general resistor so long as it has a resistance value capable of restraining an inrush current. This is also applicable to the following embodiments. A diode, e.g., diode D1 may be referred to as a switching element in the following description and claims, because the diode is on and off depending on biasing conditions applied thereto.

Embodiment 2

Figure 2:
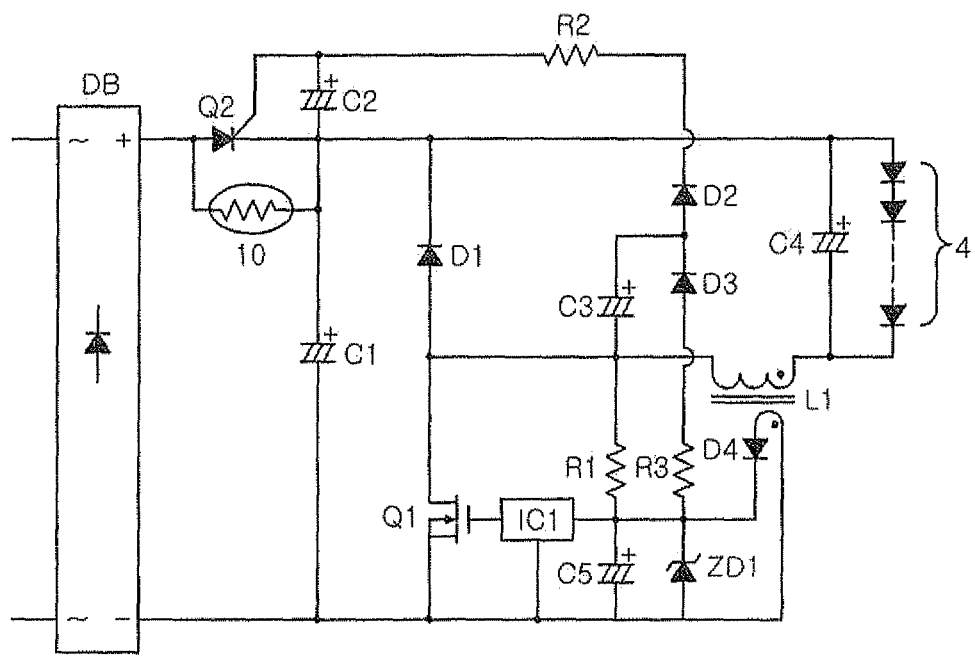
FIG. 2 is a circuit diagram of a switching power circuit in accordance with a second embodiment of the present invention.

FIG. 2 is a circuit diagram of a switching power circuit in accordance with a second embodiment of the present invention. This embodiment is different from the first embodiment, in that the switching element Q1 is disposed at the negative electrode side of the smoothing capacitor C1. A smoothing capacitor C5 for supplying a control power voltage to the control circuit IC1 of the switching element Q1 is charged through the resistor R1 by the voltage applied between two ends of the switching element Q1 at an initial stage of power input. Namely, a current flows along a path of the positive electrode of the smoothing capacitor C1→the smoothing capacitor C4→the inductor L1→the resistor R1→the smoothing capacitor C5→the negative electrode of the smoothing capacitor C1, thereby charging the smoothing capacitor C5. When the charged voltage of the smoothing capacitor C5 reaches an operation voltage of the control circuit IC1, an oscillation operation of the control circuit IC1 starts and the switching element Q1 is on-off controlled by RF.

When the switching element Q1 is turned on, a current flows along a path of the positive electrode of the smoothing capacitor C1→the smoothing capacitor C4→the inductor L1→the switching element Q1→the negative electrode of the smoothing capacitor C1, thereby accumulating energy in the inductor L1. When the switching element Q1 is turned off, the accumulated energy of the inductor L1 is discharged as a recovery current along a path of the inductor L1→the diode D1→the smoothing capacitor C4. At this time, the recovery current flows also to the smoothing capacitor C5 through a diode D4 from a secondary coil of the inductor L1, thus supplying a control power voltage of the control circuit IC1. The voltage of the smoothing capacitor C5 becomes a constant voltage regulated by the Zener diode ZD1.

When the switching element Q1 is in an ON state, the capacitor C3 is charged through the resistor R3 and the diode D3 by the voltage of the smoothing capacitor C5. Also, when the switching element Q1 is in an OFF state, the recovery current flows along a path of the inductor L1→the smoothing capacitor C3→the diode D2→the resistor R2→the capacitor C2→the smoothing capacitor C4→the inductor L1, thereby charging the capacitor C2. Accordingly, when the voltage of the capacitor C2 is increased to be higher than a firing voltage of the reverse-blocking triode thyristor Q2, the thyristor Q2 is turned on. Thereafter, since the PTC thermistor 10 is shorted by the thyristor Q2, an unnecessary loss of power by the PTC thermistor 10 is not caused.

In accordance with the present embodiment, the thyristor Q2 is fired by securing the control power voltage of the control circuit IC1 from a secondary coil of the inductor L1 of the step-down chopper circuit, transmitting the control power voltage to the capacitor C3 for a charge relay when the switching element Q1 is turned on, and transmitting charges of the capacitor C3 to the capacitor C2 when the switching element Q1 is turned off (when the diode D1 is turned on). Thus, the thyristor Q2 is turned on after the step-down chopper circuit starts an RF ON/OFF operation, and accordingly, the inrush current can be reliably prevented.

In the first and second embodiments, the step-down chopper circuit has been illustrated in the switching power circuit, but the present invention is not limited thereto and, for example, the switching power circuit may have a half-bridge circuit.

Embodiment 3

Figure 3:
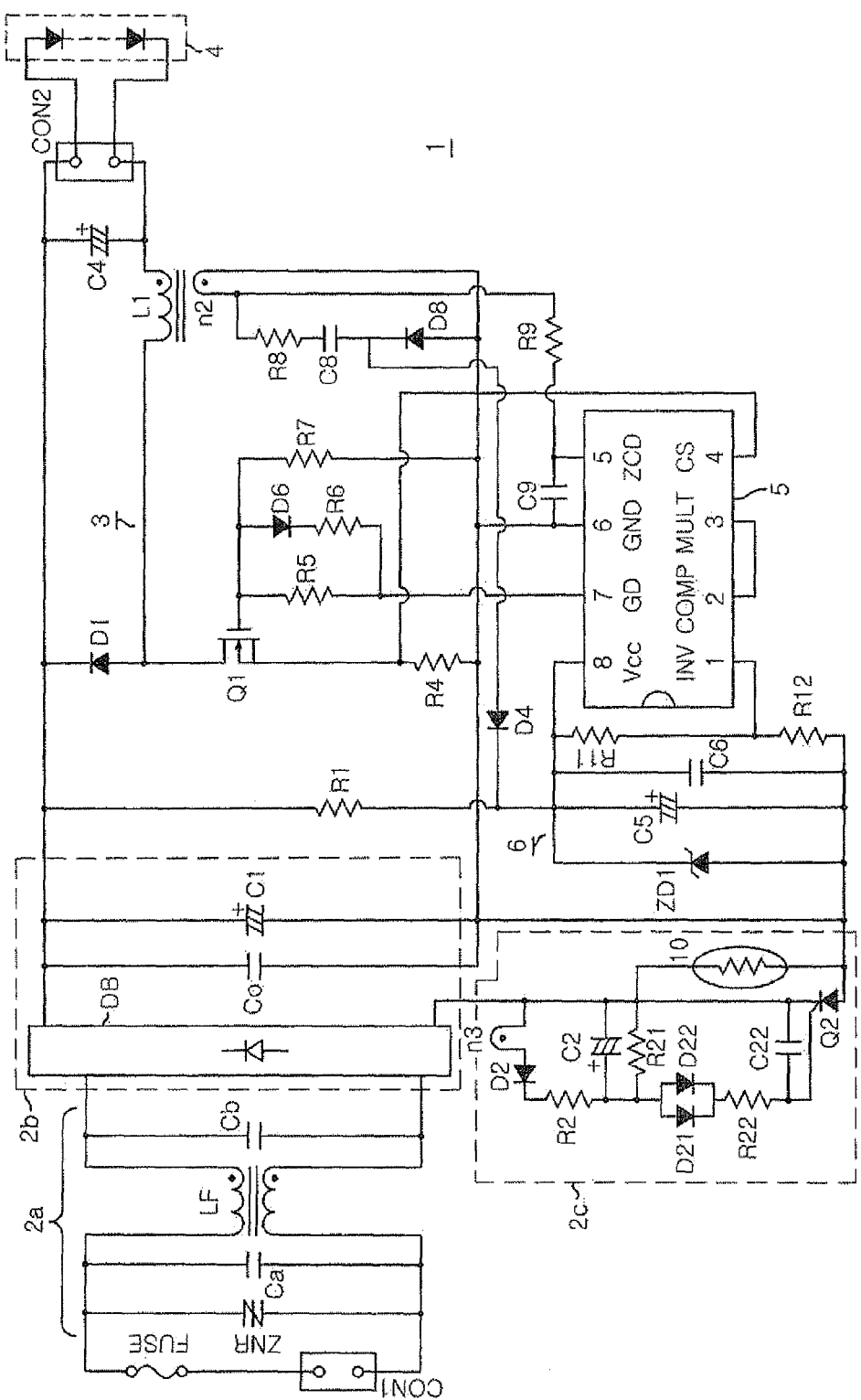
FIG. 3 is a circuit diagram of a lighting device for semiconductor light-emitting element in accordance with a third embodiment of the present invention.

FIG. 3 is a circuit diagram of a lighting device for semiconductor light-emitting element in accordance with a third embodiment of the present invention. In the present embodiment, since a current detection resistor R4 is provided to be connected in series to the switching element Q1, an error in a detection value of a switching current occurs when the capacitor C2 is to be charged based on the principle of the switching power circuit of FIG. 1 or 2. Thus, in the present embodiment, an independent tertiary coil n3 is provided at the inductor L1 and a driving current of the thyristor Q2 is supplied by an output of the tertiary coil n3.

A commercial AC power (100 V, 50/60 Hz) is connected to a power connector CON1.

The semiconductor light-emitting element 4 such as LEDs is connected to an output connector CON2. The semiconductor light-emitting element 4 may be an LED module in which multiple LEDs is connected in series, in parallel, or in series-parallel.

A DC power source circuit 2b is connected to the power connector CON1 through a current fuse FUSE and a filter circuit 2a. The filter circuit 2a includes a surge voltage absorption element ZNR, filter capacitors Ca and Cb, and a common mode choke coil LF. The DC power source circuit 2b includes a full-wave rectifying circuit DB and a rectifying smoothing circuit having smoothing capacitors C1 and Co.

A DC output terminal of the full-wave rectifying circuit DB is connected to the smoothing capacitor C1 through the PTC thermistor 10. The PTC thermistor 10 is a thermistor having a resistance increasing with an increase of temperature. The smoothing capacitor C1 has a capacitance of, for example, about tens of μF. The capacitor Co connected in parallel to the smoothing capacitor C1 is a small capacitance capacitor for RF bypass.

Immediately after a power is input, the DC output terminal of the full-wave rectifying circuit DB is shorted to the smoothing capacitor C1 before being charged and a so-called inrush current flows. The inrush current is restricted by the PTC thermistor 10. Meanwhile, after the smoothing capacitor C12 is charged, the restriction in the current by the PTC thermistor 10 is not required. In order to prevent unnecessary power consumption from being generated, the reverse-blocking triode thyristor (SCR) Q2 is connected in parallel to the PTC thermistor 10, and after the power is input, the thyristor Q2 is controlled to be turned on when charging of the smoothing capacitor C1 is completed.

In order to generate a gate voltage of the thyristor Q2, in the present embodiment, the capacitor C2 for charge accumulation is charged through the diode D2 and the resistor R2 from the tertiary coil n3 provided at the inductor L1 of the step-down chopper circuit 3. A resistor R21 for discharging is connected in parallel to the capacitor C2. A time constant of the resistor R2, the resistor R21 and the capacitor C2 regulates a delay time until the thyristor Q2 is turned on. When the voltage of the capacitor C2 increases, a gate voltage is supplied to the thyristor Q2 through a parallel circuit of diodes D21 and D22 and a resistor R22. Also, a capacitor C22 connected in parallel between a gate and a cathode of the thyristor Q2 serves to prevent malfunction. A circuit including the resistors R2, R21 and R22, the capacitors C2 and C22, the diodes D2, D21 and D22, the thyristor Q2, the PTC thermistor 10, and the tertiary coil n3 of the inductor L1 forms an inrush current preventing circuit 2c.

The step-down chopper circuit 3 is connected to an output terminal of the DC power source circuit 2b. The step-down chopper circuit 3 includes the inductor L1 connected in series to the semiconductor light-emitting element 4 lighted by a DC current, the switching element Q1 connected in series between the series circuit of the semiconductor light-emitting element 4 and the output of the DC power source circuit 2b, and the recovery diode D1 connected in parallel to the series circuit of the inductor L1 and the semiconductor light-emitting element 4, the recovery diode D1 being connected in a direction in which the accumulated energy of the inductor L1 is emitted to the semiconductor light-emitting element 4 when the switching element Q1 is turned off. Further, the capacitor C4 is connected in parallel to the semiconductor light-emitting element 4. The capacitance of the capacitor C4 is a capacitance set to smooth a pulsating component by an ON/OFF operation of the switching element Q1 and allow a smoothed DC current to flow to the semiconductor light-emitting element 4.

The switching element Q1 is on-off controlled by RF under a control of the control IC 5. Here, L6562 manufactured by STME (ST Microelectronics), is used as the control IC 5. The chip L6562, which is originally a control IC of the PFC circuit (a boosting chopper circuit for controlling a power factor enhancement), includes an extra component for controlling the step-down chopper circuit, such as an internal multiplier circuit or the like. Meanwhile, in order to control an average value of an input current in a similar manner to that of an envelope of an input voltage, the control IC 5 includes a function of controlling a peak value of the input current and a zero cross control function within one chip, and these functions are dedicated to control the step-down chopper circuit.

Figure 4:
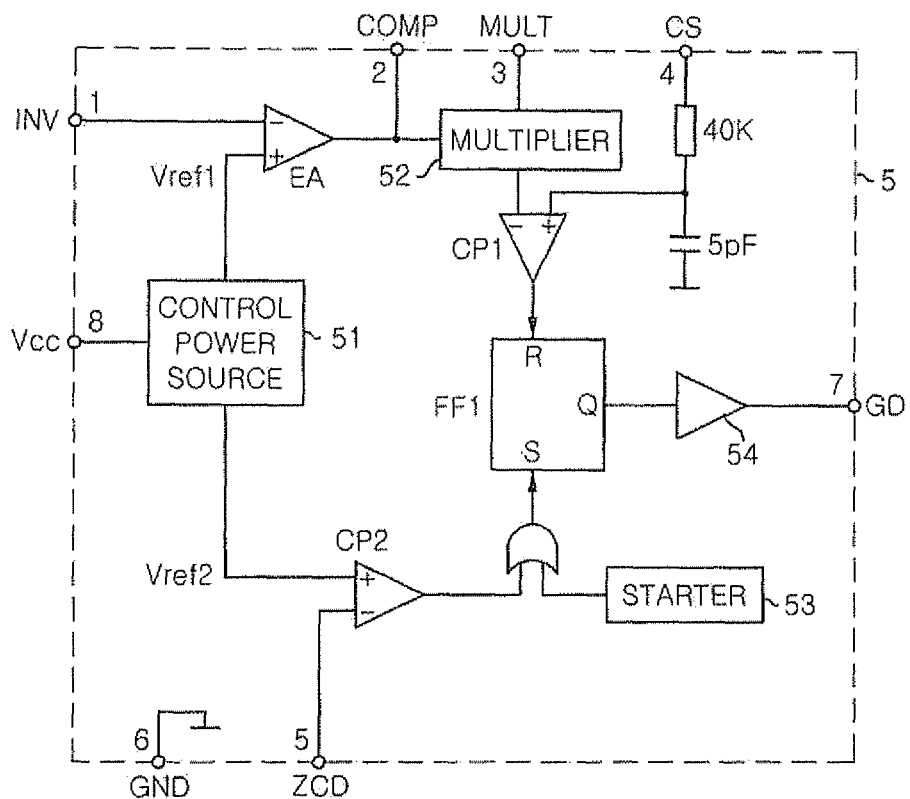
FIG. 4 is a block circuit diagram showing an internal configuration of a control integrated circuit used in the lighting device for semiconductor light-emitting element in accordance with the third embodiment of the present invention.

FIG. 4 is a schematic diagram showing an internal configuration of the control IC 5 used in the present embodiment. A first pin INV is an inverting input terminal of an internal error amplifier EA. A second pin COMP is an output terminal of the error amplifier EA. A third pin MULT is an input terminal of a multiplier circuit 52. A fourth pin CS is a chopper current detection terminal. A fifth pin ZCD is a zero-cross detection terminal. A sixth pin GND is a ground terminal. A seventh pin GD is a gate drive terminal. An eighth pin Vcc is a power source terminal.

When a control power voltage of equal to or higher than specific value is supplied between the power source terminal Vcc and the ground terminal GND, reference voltages Vref1 and Vref2 are generated by a control power source 51 and each circuit within the IC becomes to be operable. When a power is input by a starter 53, a start pulse is supplied to a set input terminal S of a flipflop FF1, so that an output Q of the flipflop FF1 becomes a high level. Accordingly, the seventh pin (gate driver terminal GD) becomes a high level through a driving circuit 54.

When the seventh pin (gate drive terminal GD) becomes a high level, a gate driving voltage divided by the resistors R5 and R7 in FIG. 3 is applied between the gate and the source of the switching element Q1 formed of a MOSFET. Since the resistor R4 has a small resistance for a current detection, it rarely affects the driving voltage between the gate and source.

When the switching element Q1 is turned on, a current flows from the positive electrode of the capacitor C1 to the negative electrode of the capacitor C1, through the capacitor C4, the inductor L1, the switching element Q1 and the resistor R4. Here, a chopper current i flowing through the inductor L1 is almost linearly increased unless the inductor L1 is self-saturated. This current is detected by the resistor R4 and input to the fourth pin CS of the control IC 5.

The fourth pin CS of the control IC 5 is a chopper current detection terminal and a voltage thereof is applied to a positive input terminal of a comparator CP1 through a noise filter of 5 µF and 40 KΩ within the IC. A reference voltage is applied to a negative input terminal of the comparator CP1. The reference voltage is determined by a voltage applied to the first pin INV and that applied to the third pin MULT.

When the voltage of the chopper current detection terminal CS exceeds the reference voltage, an output from the comparator CP1 becomes a high level and a reset signal is input to a reset input terminal R of the flipflop FF1. Accordingly, an output Q of the flipflop FF1 becomes a low level. At this time, since the driving circuit 54 is operated to push in a current from the seventh pin (gate drive terminal GD), the diode D6 of FIG. 3 is turned on, charges between the gate and the source of the switching element Q1 are discharged through a resistor R6, and the switching element Q1 formed of a MOSFET is immediately turned off.

When the switching element Q1 is turned off, electronic energy accumulated in the inductor L1 is discharged to the capacitor C4 through the recovery diode D1. At this time, since the voltage applied between two ends of the inductor L1 is clamped to a voltage Vc4 of the capacitor C4, the current i of the inductor L1 is gradually reduced with a substantially constant tilt (di/dt≈Vc4/L1).

When the voltage Vc4 of the capacitor C4 is high, the current i of the inductor L1 is sharply attenuated, and when the voltage Vc4 of the capacitor C4 is low, the current i of the inductor L1 is gently attenuated. Thus, a required time until the current i of the inductor L1 is lost varies even though a peak value of the current flowing through the inductor L1 is constant. The required time is short as the voltage Vc4 of the capacitor C4 is high while being long as the voltage Vc4 of the capacitor C4 is low.

While the current i is flowing across the inductor L1, a voltage depending on the slope of the current i of the inductor L1 is generated at the secondary coil n2 of the inductor L1. This voltage is lost when the current i of the inductor L1 flows completely, and a corresponding timing is detected by the fifth pin (zero-cross detection terminal ZCD). A resistor R9 and a capacitor C9 connected to the fifth pin form a filter circuit.

An negative input terminal of the comparator CP2 for zero-cross detection is connected to the fifth pin (zero-cross detection terminal ZCD) of the control IC 5. A reference voltage Vref2 for zero-cross detection is applied to the positive input terminal of the comparator CP2. When the voltage of the secondary coil n2 which has been applied to the fifth pin (zero-cross detection terminal ZCD) is lost, an output of the comparator CP2 becomes a high level and a set plus is supplied to a set input terminal S of the flipflop FF1 through an OR gate, so that the output Q of the flipflop FF1 becomes a high level. Accordingly, the seventh pin (gate driver terminal GD) becomes a high level through the driving circuit 54. Same operation is repeated thereafter.

Through the foregoing operation, a DC voltage obtained by stepping down the voltage of the capacitor C1 can be obtained at the capacitor C4. This DC voltage is supplied to the semiconductor light-emitting element 4 though the output connector CON2.

In case where LEDs are used as the semiconductor light-emitting element 4, the voltage Vc4 of the capacitor C4 is clamped substantially to n×Vf, given that a forward voltage of the LEDs is Vf and the number of the LEDs connected in series is n.

When the number n of LEDs connected in series is large, since the voltage Vc4 of the capacitor C4 is high, a voltage difference (Vc1−Vc4) between the voltage Vc4 and the voltage Vc1 of the capacitor C1 is reduced. For this reason, when the switching element Q1 is turned on, a voltage divided to the inductor L1 is reduced and a rising speed di/dt=(Vc1−Vc4)/L1 of the current i flowing across the inductor L1 is decreased. As a result, a time until the current i flowing across the inductor L1 reaches a certain peak value is lengthened, and thus, an ON time of the switching element Q1 is lengthened.

When the switching element Q1 is turned off, counter electromotive force generated between two ends of the inductor L1 is clamped to the voltage Vc4(=n×Vf) of the capacitor C4. Thus, when the number of LEDs connected in series is large, a voltage applied to the inductor L1 when the switching element Q1 is turned off is high and an attenuation speed di/dt=−Vc4/L1 of the current i flowing across the inductor L1 is increased. As a result, a time until the current i flowing across the inductor L1 becomes zero is shortened and an OFF time of the switching element Q1 is shortened.

When the number n of LEDs connected in series is small, in reverse to the foregoing description, the ON time of the switching element Q1 is shortened and the OFF time thereof is lengthened. Namely, when the number n of the LEDs connected in series is small, since the voltage Vc4 of the capacitor C4 is low, the voltage difference (Vc1−Vc4) between the voltage Vc4 of the capacitor C4 and the voltage Vc1 of the capacitor C1 is increased. For this reason, when the switching element Q1 is turned on, the voltage divided to the inductor L1 is increased and the rising speed $di/dt=(Vc1−Vc4)/L1$ of the current i flowing across the inductor L1 is increased. As a result, when the switching element Q1 is turned on, the time until the current i flowing across the inductor L1 reaches a certain peak value is shortened and the ON time of the switching element Q1 is shortened.

When the switching element Q1 is turned off, counter electromotive force generated between two ends of the inductor L1 is clamped to the voltage $Vc4(=n×Vf)$ of the capacitor C4. Thus, when the number n of LEDs connected in series is small, a voltage applied to the inductor L1 when the switching element Q1 is turned off is low and an attenuation speed $di/dt=−Vc4/L1$ of the current i flowing across the inductor L1 is decreased. As a result, the time until the current i flowing across the inductor L1 becomes zero is lengthened and the OFF time of the switching element Q1 is lengthened.

In this manner, in the lighting device in accordance with the present embodiment, the ON time of the switching element Q1 is automatically lengthened and the OFF time thereof is shortened when the number n of the LEDs connected in series is increased, while the ON time of the switching element Q1 is automatically shortened and the OFF time thereof is lengthened when the number n of the LEDs connected in series is reduced. Thus, the lighting device in accordance with the present embodiment is configured to have a mechanism that can maintain the constant current characteristics regardless of the number n of the LEDs connected in series.

In the present embodiment, a timing at which the current flowing across the inductor L1 becomes substantially zero is detected by detecting a timing at which a voltage of the secondary coil n2 of the inductor L1 is lost. However, other means may be used so long as it can detect a timing at which a recovery current is lost, such as detecting an increase in a reverse voltage of the recovery diode D1, detecting a drop of the voltage applied between two ends of the switching element Q1, or the like.

Hereafter, the configuration of the control power circuit 6 will be described. In the present embodiment, the capacitor C5 and the Zener diode ZD1 for regulating the voltage of the capacitor C5 are provided to supply a charge current from the positive electrode of the capacitor C1 to the positive electrode of the capacitor C5 through the charge resistor R1. Further, in order to provide a power supply unit having high efficiency, a configuration in which the capacitor C5 is charged from the secondary coil n2 of the inductor L1 in a normal time is used together.

The voltage of the capacitor C1 is near to a peak value of about 140 V of the commercial AC power source voltage of 100 V and 50/60 Hz. A charge current is supplied from the capacitor C1 to the capacitor C5 for supplying the control power voltage Vcc through the step-down resistor R1.

When the voltage of the capacitor C5 is increased to equal to or be higher than an operation voltage of the control IC 5, an ON/OFF operation of the switching element Q1 is initiated and an RF triangular wave current flows across the inductor L1, so that an RF square wave voltage is generated from the secondary coil n2. When the switching element Q1 is turned on, a current flows through a diode D8, a capacitor C8, and a resistor R8 by the voltage generated from the secondary coil n2 of the inductor L1, thus charging the capacitor C8. When the switching element Q1 is turned off, a voltage of a reverse polarity is generated from the secondary coil n2 of the inductor L1, so that a charge current flows to the capacitor C5 through the diode D4 and the resistor R8 by the voltage obtained by adding the voltage of the reverse polarity voltage and the charge voltage of the capacitor C8. Accordingly, the voltage of the capacitor C5 is to be increased further. However, since the Zener diode ZD1 is connected in parallel, the voltage is clamped by a Zener voltage, thereby generating a uniform control power voltage Vcc.

Further, the voltage of the capacitor C5 for supplying the control power voltage Vcc is about several ten volts. A capacitor C6 connected in parallel to the capacitor C5 is a small capacitance capacitor for bypassing an RF component of the charge current passing through the diode D4.

The control power voltage Vcc is divided by the resistors R11 and R12 and applied to the first pin INV of the control IC 5. As described above, this voltage is used to regulate the peak value of the current flowing across the switching element Q1. The second pin COMP and the third pin MOLT of the control IC 5 are short-circuited in this embodiment.

According to the configuration of the present embodiment, even when a load is changed, an average value of a chopper current is hardly changed. Thus, an effective value of an output current obtained by smoothing the pulsating component of the chopper current by the capacitor C4 and supplied to the load is substantially uniform irrespective of the load.

In order to realize the constant current control, in the present embodiment, a current flowing across the switching element Q1 is detected by the current detection resistor R4. For this reason, when the capacitor C2 of the inrush current preventing circuit is to be charged based on the principle of the switching power circuit of FIG. 1, the charge current of the capacitor C2 when the switching element Q1 is turned on overlaps with a switching current, thus making it impossible to accurately control a peak value of the switching current. In this respect, according to the configuration of FIG. 3, since the charge current of the capacitor C2 does not overlap with the switching current, the peak value of the switching current can be accurately controlled.

In addition, in the present embodiment, since the switching element Q1 is turned on at a timing when the recovery current flowing across the diode D1 becomes zero, a switching loss is reduced and the peak value of the switching current and the average value (=peak value÷2) of a load current are adjusted to be strictly in proportion to each other. For example, when the capacitor C2 is to be charged based on the foregoing principle of the switching circuit of FIG. 2, the charge current of the capacitor C2 flows in a direction in which the recovery current of the diode D1 is negated when the switching element Q1 is turned off, and a timing at which the recovery current of the inductor L1 is zero-crossed cannot be accurately detected. In this respect, according to the configuration of FIG. 3, since the charge current of the capacitor C2 does not flow in a direction in which the recovery current is negated, the timing of zero-cross can be accurately detected.

As described above, when the constant current control is performed by combining the ON control of the switching element Q1 by using a detection of the zero-cross of the recovery current and the OFF control of the switching element Q1 by using a detection of the peak of the switching current, charging the capacitor C2 based on the principle of FIG. 1 or 2 is not desirable, and charging the capacitor C2 by using the independent tertiary coil n3 as shown in FIG. 3 is considered to be superior.

In addition, in a modification of the present embodiment, it may be configured such that the reverse-blocking triode thyristor Q2 of FIG. 3 is replaced by a bi-directional thyristor having a control electrode (triac), one main electrode T1 serving as the control electrode is connected to the negative electrode of the capacitor C2, the other main electrode T2 is connected to the negative electrode of the full-wave rectifying circuit DB, and a voltage of the capacitor C2 is supplied between the main electrode T1 and a gate electrode G. In such configuration, the bi-directional thyristor (triac) can be turned on with a fourth upper limit. In this case, the inrush current preventing circuit 2c can be considerably simplified and can be realized as a parallel circuit of the bi-directional thyristor (triac) and the PTC thermistor 10.

Embodiment 4

Figure 5:
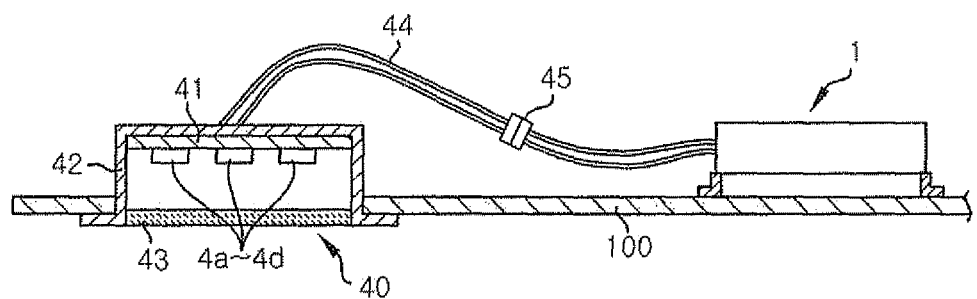
FIG. 5 is a sectional view showing a schematic configuration of an illumination apparatus of a fourth embodiment of the present invention.

FIG. 5 is a sectional view showing a schematic configuration of a power source separation type LED illumination apparatus using the LED lighting device in accordance with the present invention. This power source separation type LED illumination apparatus includes a lighting device 1 as a power source unit accommodated in a case different from a housing body 42 of an LED module 40. Accordingly, the LED module 40 can be thinner, and the lighting device 1, which is a separately installed power source unit, can be installed at various places.

The mechanism housing body 42 is formed as a cylindrical body made of a metallic material with a lower end opened, and the lower opened portion is covered by a light diffusion plate 43. The LED module 40 is disposed to face the light diffusion plate 43. Reference numeral 41 denotes an LED mounting substrate, on which LEDs 4a to 4d of the LED module 40 are mounted. The mechanism housing body 42 is buried in a ceiling 100, and wired to the lighting device 1 serving as a power source unit disposed behind the ceiling through a lead wire 44 and a connector 45.

The circuits as shown in FIGS. 1 to 3 are received in the interior of the lighting device 1. The series circuit of the LEDs 4a to 4d, i.e., LED module 40, corresponds to the foregoing semiconductor light-emitting element 4.

In the present embodiment, the power source separation type LED lighting device in which the lighting device 1 serving as a power source unit is received in a housing body different from the LED module 40 is illustrated. However, the lighting device of the present invention may be used in the power source integration type LED illumination apparatus in which a power source unit is received in the same housing body as that of the LED module 40.

Further, the lighting device in accordance with the present invention is not limited to illumination apparatus, and may be used as a light source of various devices such as a backlight of a LCD monitor, a copy machine, a scanner, a projector or the like.

In the foregoing respective embodiments, the LEDs have been illustrated as an example of the semiconductor light-emitting element 4. However the present invention is not limited thereto, and the semiconductor light-emitting element 4 may be, for example, an organic EL element a semiconductor laser element, or the like.

In accordance with the present invention, even when the inductive element of the switching power circuit is not directly connected to the first smoothing capacitor, a driving current of the semiconductor switching element, which is connected in parallel to the current limiting resistor for preventing an inrush current, can be supplied from the inductive element by using an ON/OFF operation of the first or second switching element. Thus, the semiconductor switching element connected in parallel to the current limiting resistor can be maintained in an OFF state until a switching operation starts, and accordingly, an inrush current can be reliably restrained.

While the invention has been shown and described with respect to the particular embodiments, it will be understood by those skilled in the art that various changes and modification may be made.

What is claimed is:

1. A switching power circuit comprising:
a rectifying circuit for rectifying AC power;
a first capacitor connected to an output terminal of the rectifying circuit through a current limiting resistor for restraining an inrush current, the first capacitor being a smoothing capacitor;
a first switching element having one end connected to a positive electrode of the first capacitor;
a second switching element having one end connected to a negative electrode of the first capacitor;
an inductive element having one end connected to the other ends of the first and the second switching element;
a semiconductor switching element connected in parallel to the current limiting resistor; and
a second capacitor connected to a control electrode of the semiconductor switching element,
wherein the second capacitor is charged by using a voltage induced to the inductive element when the first or the second switching element is off.

2. The switching power circuit of claim 1, wherein a negative electrode of the second capacitor is connected to the positive electrode of the first capacitor,
wherein the switching power circuit further comprises:
a third capacitor having a negative electrode connected to said one end of the inductive element; and
a current path for transmitting charges toward a positive electrode of the second capacitor from a positive electrode of the third capacitor when the first switching element is on.

3. The switching power circuit of claim 2, wherein the third capacitor is charged from an intermediate tab of the inductive element or charged by a voltage applied between two ends of the first switching element when the second switching element is on.

4. The switching power circuit of claim 2, wherein the first switching element has a control electrode,
wherein the switching power circuit further comprises a control circuit for providing a control signal to the control electrode, and
wherein the third capacitor provides a control power voltage to the control circuit.

5. The switching power circuit of claim 2, wherein the second switching element has a control electrode,
wherein the switching power circuit further comprises at the negative electrode side of the first capacitor:
a control circuit for providing a control signal to the control electrode; and
a control power circuit for providing a control power voltage to the control circuit,
wherein the switching power circuit further comprises a current path for allowing a charge current to flow to the positive electrode of the third capacitor from a positive electrode of the control power circuit when the second switching element is on.

6. The switching power circuit of claim 1, wherein one of the first and the second switching element has a control electrode, and the other is a diode reversely biased by the first capacitor.

7. A lighting device for lighting a semiconductor light-emitting element comprising:
the switching power circuit of claim 1.

8. An illumination apparatus comprising:
the lighting device of claim 7; and
the semiconductor light-emitting element connected between the other end of the inductive element and the positive electrode or the negative electrode of the first capacitor.

* * * * *